(12) United States Patent
Delehouze et al.

(10) Patent No.: US 12,269,780 B2
(45) Date of Patent: Apr. 8, 2025

(54) METHOD FOR COATING SHORT FIBRES

(71) Applicants: SAFRAN CERAMICS, Le Haillan (FR); CENTRE NATIONAL DE LA RECHERCHE SCIENTIFIQUE, Paris (FR); UNIVERSITE DE BORDEAUX, Bordeaux (FR)

(72) Inventors: Arnaud Delehouze, Moissy-Cramayel (FR); Eric Bouillon, Moissy-Cramayel (FR); Nathalie Dominique Bertrand, Saint-Maixant (FR); Alain Jean-Michel Guette, Le Bouscat (FR); Armine El Mansouri, Bordeaux (FR)

(73) Assignees: SAFRAN CERAMICS, Le Haillan (FR); CENTRE NATIONAL DE LA RECHERCHE SCIENTIFIQUE, Paris (FR); UNIVERSITE DE BORDEAUX, Bordeaux (FR)

( * ) Notice: Subject to any disclaimer, the term of this patent is extended or adjusted under 35 U.S.C. 154(b) by 131 days.

(21) Appl. No.: 18/012,121

(22) PCT Filed: Jun. 21, 2021

(86) PCT No.: PCT/FR2021/051123
§ 371 (c)(1),
(2) Date: Dec. 21, 2022

(87) PCT Pub. No.: WO2022/003269
PCT Pub. Date: Jan. 6, 2022

(65) Prior Publication Data
US 2023/0174431 A1    Jun. 8, 2023

(30) Foreign Application Priority Data
Jul. 1, 2020 (FR) ....................................... 2006957

(51) Int. Cl.
*C04B 35/628* (2006.01)
*C04B 35/64* (2006.01)
(Continued)

(52) U.S. Cl.
CPC .. *C04B 35/62884* (2013.01); *C04B 35/62868* (2013.01); *C04B 35/62871* (2013.01);
(Continued)

(58) Field of Classification Search
CPC ..... C23C 16/442; C23C 16/26; C23C 16/045; C23C 16/342; C04B 35/80; C04B 35/64;
(Continued)

(56) References Cited

U.S. PATENT DOCUMENTS 4,583,299 A * 4/1986 Brooks .................. C01G 49/02
432/15
4,686,116 A * 8/1987 Rickborn ................ C23C 16/26
427/122

(Continued)

FOREIGN PATENT DOCUMENTS

DE    10 2007 049635 A1    4/2009
DE    10 2012 218184 A1    4/2014
(Continued)

OTHER PUBLICATIONS

International Search Report as issued in International Patent Application No. PCT/FR2021/051123, dated Sep. 15, 2021.
(Continued)

*Primary Examiner* — Emmanuel S Luk
(74) *Attorney, Agent, or Firm* — Pillsbury Winthrop Shaw Pittman LLP

(57) ABSTRACT

A method for coating fibres includes coating short fibres having an average length less than or equal to 5 mm by chemical vapour deposition in a fluidised bed, the short fibres treated being made of ceramic material or carbon and
(Continued)

being mixed with spacer particles distinct from the short fibres, the spacer particles having an average diameter greater than or equal to 20 µm.

10 Claims, 2 Drawing Sheets

(51) Int. Cl.
    *C04B 35/80*     (2006.01)
    *C23C 16/04*     (2006.01)
    *C23C 16/26*     (2006.01)
    *C23C 16/34*     (2006.01)
    *C23C 16/442*     (2006.01)

(52) U.S. Cl.
    CPC ........ *C04B 35/62873* (2013.01); *C04B 35/64* (2013.01); *C04B 35/80* (2013.01); *C23C 16/045* (2013.01); *C23C 16/26* (2013.01); *C23C 16/342* (2013.01); *C23C 16/345* (2013.01); *C23C 16/442* (2013.01); *C04B 2235/5244* (2013.01); *C04B 2235/5248* (2013.01)

(58) Field of Classification Search
    CPC ........ C04B 35/62871; C04B 35/62884; C04B 35/62868; C04B 35/62873
    See application file for complete search history.

(56) References Cited

U.S. PATENT DOCUMENTS

| | | | |
|---|---|---|---|
| 6,015,773 A * | 1/2000 | Wysong | A01N 25/28 |
| | | | 424/490 |
| 6,143,376 A | 11/2000 | Linn et al. | |
| 6,783,856 B1 * | 8/2004 | Clough | C23C 16/4417 |
| | | | 428/407 |
| 6,890,986 B2 | 5/2005 | Pruett | |
| 11,214,865 B2 * | 1/2022 | Johansson | B22F 1/18 |
| 2002/0037247 A1 | 3/2002 | Pruett | |
| 2007/0053846 A1 * | 3/2007 | Dave | C23C 24/04 |
| | | | 424/46 |
| 2007/0207266 A1 | 9/2007 | Lemke | |
| 2008/0261116 A1 * | 10/2008 | Burton | C23C 16/24 |
| | | | 427/113 |
| 2013/0059073 A1 * | 3/2013 | Jiang | C04B 35/62222 |
| | | | 118/715 |
| 2019/0185387 A1 | 6/2019 | Jackson | |
| 2023/0398570 A1 * | 12/2023 | Scheltjens | C23C 16/452 |

FOREIGN PATENT DOCUMENTS

| | | |
|---|---|---|
| FR | 2 939 130 A1 | 6/2010 |
| WO | WO 2009/098784 A1 | 8/2009 |
| WO | WO 2019/245792 A1 | 12/2019 |

OTHER PUBLICATIONS

First Office Action as issued in Chinese Patent Application No. 202180047430.7, dated Jun. 1, 2024.

* cited by examiner

[Fig. 1]
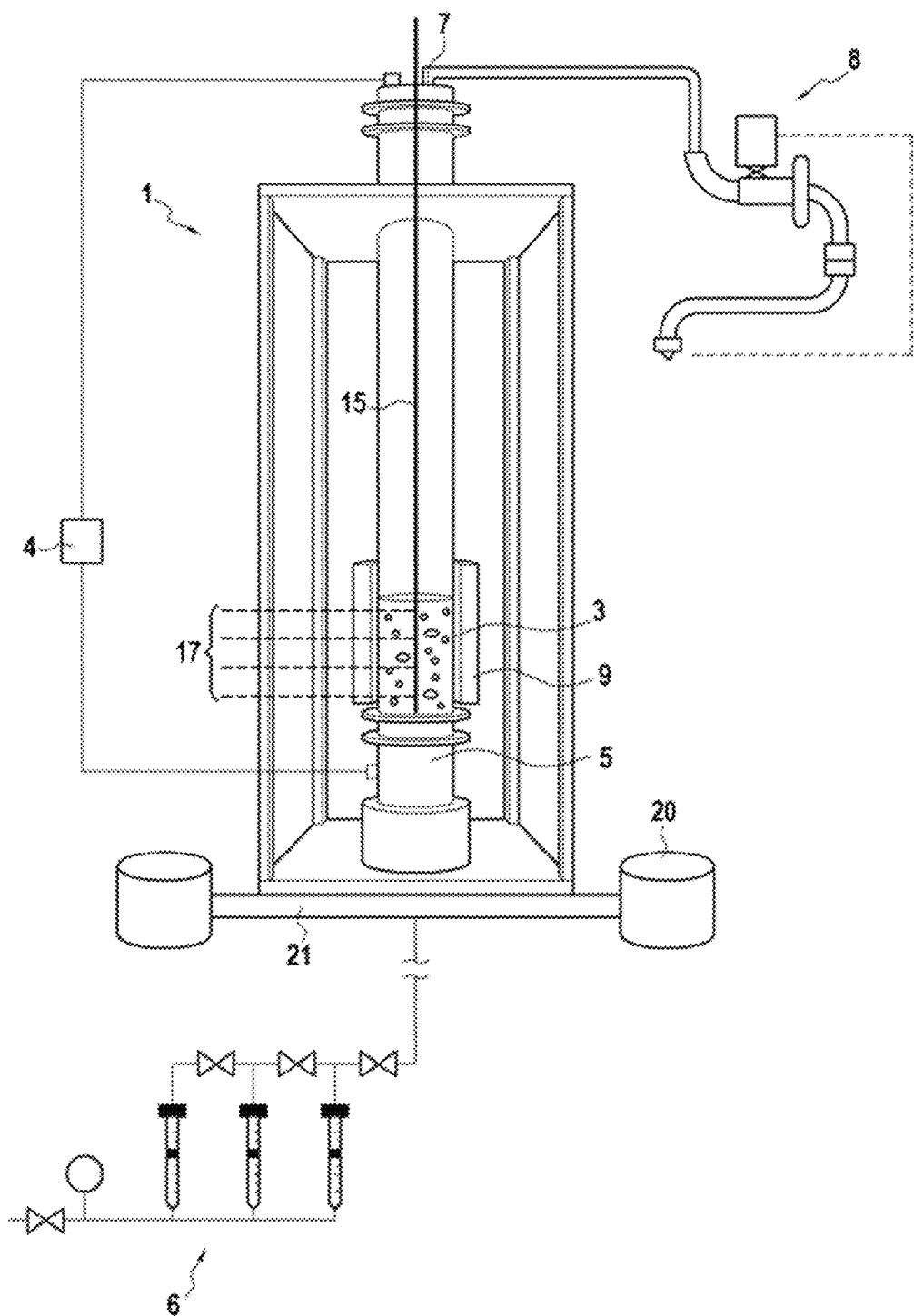

[Fig. 2]
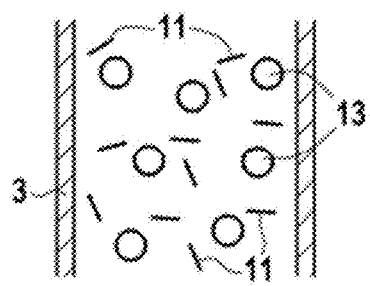
[Fig. 3]
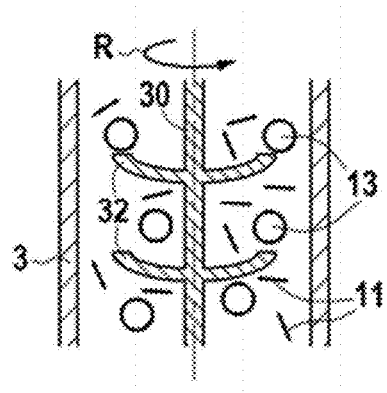
[Fig. 4]
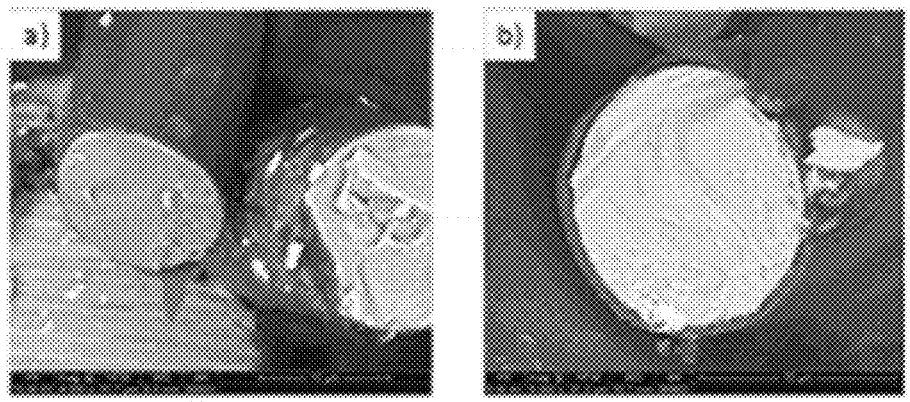

METHOD FOR COATING SHORT FIBRES

CROSS-REFERENCE TO RELATED APPLICATIONS

This application is the U.S. National Stage of PCT/FR2021/051123, filed Jun. 21, 2021, which in turn claims priority to French patent application number 20 06957 filed Jul. 1, 2020. The content of these applications are incorporated herein by reference in their entireties.

TECHNICAL FIELD

The present invention relates to a method for coating short fibres by chemical vapour deposition in a fluidised bed.

PRIOR ART

Ceramic matrix composite materials (CMC materials) have good thermostructural properties, in other words high mechanical properties which make them suitable for forming structural parts, and the ability to retain these properties at high temperatures. CMC parts may comprise a textile reinforcement formed of long continuous fibres woven in the stress directions of the final composite part. The weaving step is an expensive step and the use of a woven fibrous reinforcement may present limitations in the case of parts with complex geometry or small size. Indeed, the minimum weaving pitch may prove too coarse for producing a small geometric detail.

In order to solve this problem, it has been envisaged to use a reinforcement that is no longer formed of long continuous fibres, but of short fibres dispersed in the matrix. However, it is well-known that the function of a CMC material requires specific management of the interfacial bonds between fibres and matrix, in order to obtain the hard to damage nature of the composite final. This modulation of the interfaces is conventionally obtained by positioning an interphase between the fibre and the matrix.

In addition to the interphase coating, it may prove desirable in certain cases to protect the fibrous reinforcement by an additional refractory coating in order to protect the fibres against stresses resulting from later matrix formation steps. In the case of woven fibrous reinforcements, the forming of an interphase and the additional refractory coating can be carried out by chemical vapour infiltration. This deposition technique is not always directly applicable for coating short fibres. Indeed, a clump of short fibres treated by this conventional chemical vapour infiltration technique will lead to a partially consolidated agglomerate resulting from the fibres being glued together by the deposited coating, and thus to fibres which are not coated in a homogeneous and unitary manner. Another possible solution would be to coat continuous long fibres by passage in a chemical vapour deposition chamber, then cutting these coated long fibres to the desired length in order to obtain coated short fibres. However, the cutting step to obtain short fibres can lead to an inhomogeneous coating on the cut fibres, or even to damage thereof. In the specific case of a consolidation by the method of melt infiltration (MI) or reactive melt infiltration (RMI). An inhomogeneous coating can lead to a chemical attack of the fibres by the molten silicon used to form the matrix by the melt infiltration technique and therefore to degradation of the mechanical properties of the part.

It is therefore desirable to have a method which can limit, or even prevent, the formation of aggregates during the coating of short fibres and improve the homogeneity of the coating formed.

DISCLOSURE OF THE INVENTION

The invention relates to a method for coating fibres, comprising at least:

coating short fibres having an average length less than or equal to 5 mm by chemical vapour deposition in a fluidised bed, the short fibres treated being made of ceramic material or carbon and being mixed with spacer particles distinct from the short fibres, said spacer particles having an average diameter greater than or equal to 20 μm.

Unless otherwise stated, an "average" dimension shall mean the dimension given by the statistical particle size distribution to half of the population, referred to as d50. The invention proposes coating the short fibres using a technique of chemical vapour deposition in a fluidised bed, while adding spacer particles to the short fibres, which enable them to be separated and limits, or even prevents, the formation of aggregates during the coating. Thus, short fibres that are coated in a unitary and homogeneous manner are obtained. The short fibres thus coated can then be used to form the discontinuous fibrous reinforcement of a composite material part. The invention is of particular interest for the production of composite material parts that are small or have a complex geometry, but is not however limited to these applications.

In an exemplary embodiment, the spacer particles are present at a level of at least 5%, for example at least 25%, for example at least 50%, by volume in the mixture with the short fibres. In other words, the ratio R=[volume of spacer particles]/[(volume of spacer particles)+(volume of short fibres)] is greater than or equal to 5%, for example greater than or equal to 25%, for example greater than or equal to 50%.

These features make it possible to still further separate the particles during coating and can have a particular advantage in the case where the sizing remains on the treated fibres in order to reduce the clumps of fibres agglomerated by this sizing and to obtain a unitary and homogeneous coating of the fibres.

In an exemplary embodiment, the average diameter of the spacer particles is greater than or equal to 50 μm, for example greater than or equal to 100 μm. Such a feature makes it possible to still further separate the particles during the coating and to still further improve the homogeneity and unitary character of the coating formed.

In an exemplary embodiment, during the coating, the mixture of short fibres and spacer particles is stirred using a stirring member.

Such a feature can still further reduce the risk of obtaining unwanted aggregates during the coating.

In an exemplary embodiment, the short fibres and the spacer particles are present in a reactor during the coating, and a vibratory motion is imposed on said reactor during the coating, using a vibrating member.

Such a feature can still further reduce the risk of obtaining unwanted aggregates during the coating.

In an exemplary embodiment, the short fibres are made of silicon carbide. Of course, the short fibres can alternatively be formed of another material such as carbon, an oxide or a nitride.

In an exemplary embodiment, on the short fibres is deposited at least one layer of: pyrolytic carbon, boron nitride, silicon-doped boron nitride, silicon nitride or boron-doped carbon. This type of coating can, in particular, be combined with the use of silicon carbide fibres.

In an exemplary embodiment, the method comprises:
introducing short fibres and spacer particles into a reactor, the short fibres being coated with a sizing,
desizing, for example by heat treatment, so as to remove all or part of the sizing of the short fibres in the reactor, and then
coating the short fibres in the reactor as defined above.

Such an embodiment concerns the case where the fibres are treated in the same reactor in order to perform the desizing and the coating. The use of spacer particles is particularly advantageous in this case in order to break up the clumps of agglomerated fibres which possibly remain despite the desizing carried out.

The invention also relates to a method for manufacturing a composite material part, comprising at least:
implementing a method such as described above, in order to obtain coated short fibres,
separating the coated short fibres from at least a portion of the spacer particles,
moulding the coated short fibres thus separated from the spacer particles so as to form a porous preform of the part to be obtained, and
forming a matrix in the pores of the preform in order to obtain the composite material part.

The invention also relates to a method for manufacturing a composite material part, comprising at least:
implementing a method such as described above, in order to obtain coated short fibres,
separating the coated short fibres from at least a portion of the spacer particles,
mixing the coated short fibres thus separated from the spacer particles with the matrix material or with a matrix precursor, and
introducing the mixture thus obtained into a mould and the heat treatment of the introduced mixture, in order to obtain the composite material part.

Various methods are possible for separating the coated short fibres from the spacer particles. In particular, sieving can be performed so as to separate the coated short fibres from at least a portion of the spacer particles due to their difference in size. Alternatively, at least a portion of the spacer particles can be magnetically attracted so as to separate them from the coated short fibres. In this case, at least a portion of the spacer particles are magnetised so as to enable this separation by magnetic attraction.

In an exemplary embodiment, the matrix comprises at least one ceramic matrix phase, for example a silicon carbide matrix phase.

In an exemplary embodiment, the part can be a turbomachine part, for example a part of an aeronautical turbomachine or industrial turbomachine.

BRIEF DESCRIPTION OF THE FIGURES

FIG. 1 schematically and partially illustrates an apparatus for implementing a method for fluidised-bed chemical vapour deposition according to the invention.

FIG. 2 illustrates, schematically and partially, the separation of short fibres by the spacer particles during coating in the apparatus of FIG. 1.

FIG. 3 illustrates, schematically and partially, the separation of short fibres by the spacer particles during coating in an alternative of the method according to the invention.

FIG. 4 provides photographs obtained by scanning electron microscopy of short fibres which have been coated by implementation of the invention.

DESCRIPTION OF THE EMBODIMENTS

The structure of an apparatus 1 that can be used for implementing a coating method according to the invention will be described with reference to FIG. 1. Fluidised-bed chemical vapour deposition is a known technique per se. However, to enable its satisfactory application to the coating of short fibres, the invention proposes adding spacer particles of relatively high diameter in order to sufficiently separate the short fibres during the coating and to thus be able to coat them in a unitary and homogeneous manner.

The apparatus 1 comprises a reactor 3 defined by a wall which may be made of quartz or Inconel®. The reactor 3 comprises an inlet 5 in communication with a gas source 6 through which the gaseous phase comprising the precursor of the coating to be formed is intended to be introduced into the reactor 3. The reactor 3 further comprises an outlet 7 in communication with a pumping system 8 in order to ensure the production of a vacuum in the reactor 3. The apparatus 1 comprises a heating system 9 for heating the inside of the reactor 3 in order to enable the formation of the coating from the introduced precursor by chemical vapour deposition. In order to stabilise the temperature of the reactor 3 during the coating, the reactor 3 can be provided with a thermally isolating element at the inlet 5.

The short fibres 11 to be coated and the spacer particles 13 are present inside the reactor 3 (see FIGS. 2 and 3). The short fibres 11 can have an average length less than or equal to 1 mm, for example less than or equal to 500 µm. The average length of the short fibres can be between 100 µm and 5 mm, for example between 100 µm and 1 mm, for example between 100 µm and 500 µm. The short fibres 11 can have an average diameter less than or equal to 20 µm, for example between 5 µm and 20 µm, or even between 8 µm and 14 µm. The short fibres 11 can be obtained from long fibres by mechanical cutting or grinding.

The short fibres 11 are made of ceramic material or carbon. The short fibres can be made of carbide, nitride or oxide ceramic material. It is possible, in particular, to use short fibres 11 made of silicon carbide, having for example an oxygen content less than or equal to 1% in atomic percent. Such short fibres 11 can be Hi-Nicalon type S fibres marketed by NGS.

To the short fibres 11 are added spacer particles 13 that are distinct from these short fibres 11. The spacer particles 13 do not need to have a fibre shape. The spacer particles 13 can be in the form of grains. The shape of the spacer particles 13 can be inscribed in a sphere. The spacer particles 13 can have a substantially spherical or ellipsoidal shape. The spacer particles 13 may have been obtained by grinding larger size particles. In order to further improve the fluidisation quality, it is advantageous to choose spacer particles 13 which belong to Geldart groupings A or B. The spacer particles 13 can be made of (oxide or non-oxide) ceramic material, such as alumina, silicon carbide or silicon nitride. Alternatively, the spacer particles 13 can be metallic.

The average diameter of the spacer particles 13 can be greater than or equal to 20 µm, for example greater than or equal to 50 µm, for example greater than or equal to 100 µm. This average diameter can be between 20 µm and 800 µm, for example between 50 µm and 800 µm, for example between 100 µm and 800 µm. This average diameter can be between 20 µm and 500 µm, for example between 50 µm and 500 µm, for example between 100 µm and 500 µm.

The content by volume of spacer particles 13 in the mixture with the short fibres 11 can be greater than or equal to 25%, for example greater than or equal to 50%, for example greater than or equal to 70%. This content by volume of spacer particles 13 in the mixture with the short fibres 11 can be between 5% and 95%, for example between 25% and 95%, for example between 50% and 95%, for example between 70% and 95%.

It is possible to treat, in the reactor 3, short fibres 11 still coated by their sizing. In this case, a heat treatment of the mixture of short fibres 11 and spacer particles 13 can be performed first, which can remove at least a portion of the sizing and thus break up the tangles of sized short fibres, which facilitates subsequent fluidisation. This heat treatment for removing the sizing can, for example, be carried out at a temperature greater than or equal to 700° C., under a flow rate of $N_2$ greater than or equal to 1000 standard cubic centimetres per minute (sccm) and preferably between 1000 sccm and 2000 sccm, in a reactor 3 of diameter 5 cm and height 1 m, for a duration ranging from 1 to 2 hours.

After this desizing treatment and without having removed the short fibres 11 from the reactor 3, the fluidisation of the mixture of short fibres 11 and spacer particles 13 is performed. The use of spacer particles 13 is particularly advantageous in this case, in order to break up the clumps of agglomerated fibres which could still be present.

FIGS. 2 and 3 illustrate the step of coating the short fibres 11. These figures illustrate the fluidisation phenomenon for the bed comprising the mixture of short fibres 11 and spacer particles 13, in which each short fibre 11 is separated from the others and "bathes" in the gaseous precursor mixture introduced into the reactor 3.

In FIGS. 2 and 3, the dimensions of the short fibres 11 and spacer particles 13 have been exaggerated for reasons of legibility.

In the exemplary apparatus 1 considered in FIG. 1, the reactor 3 can also be vibrated during the coating in order to yet further reduce the risk of obtaining unwanted aggregates. This vibration is provided by a vibrating member comprising one or more vibration motors 20 and a vibrating support 21 intended to be vibrated by the motors 20 and to communicate this vibration to the reactor 3. The vibrating support 21 can be in the form of a tray, but it does not go beyond the scope of the invention when it is present in a different form. The frequency of the vibratory motion imposed on the reactor 3 can be between 20 Hz and 50 Hz. According to an example, the vibratory motion can be produced by means of two unbalanced motors by positioning the reactor 3 at the barycentre of these. A rectilinear vibration can also be generated by imposing a rotary motion in the reverse direction at the unbalances. It may be possible to modulate the intensity of vibration, i.e. the amplitude, on each of the motors by shifting, by a certain angle, the two unbalances located at the transmission shaft. The angular shift of the unbalances can be between 10% and 100% (100% corresponding to perfectly aligned unbalances and 0% to diametrically opposite unbalances).

In the illustrated example, the vibratory motion imposed on the reactor 3 is a rectilinear movement along the height of the reactor 3. However, it does not go beyond the scope of the invention if the direction of the vibratory motion is changed by imposing, for example, vibration along the diameter of the reactor or even a non-rectilinear vibration, for example curvilinear or even circular vibration. It is however preferred to impose a rectilinear vibratory motion on the reactor 3.

The gaseous phase introduced into the reactor 3 in order to perform the coating depends on the nature of the coating to be obtained, and a person skilled in the art will use their general knowledge to select it and to select the associated deposition conditions, in terms of temperature pressure and flow rate. The gaseous phase typically comprises an inert carrier gas, such as molecular nitrogen. Gaseous precursors can be used under standard conditions, in which case they can be mixed with the carrier gas before their introduction into the reactor 3. Liquid precursors can also be used under standard conditions, in which case the carrier gas can be bubbled into the liquid precursor in order to be enriched and then be introduced into the reactor 3.

In the non-limiting example of a deposition of a pyrolytic carbon coating, molecular nitrogen can be used as carrier gas. The flow rate for introduction of the carrier gas into a reactor 3 of diameter 5 cm and height 1 m, can be between 500 standard cubic centimetres per minute and 3000 standard cubic centimetres per minute, for example between 750 standard cubic centimetres per minute and 1250 standard cubic centimetres per minute. The temperature imposed inside the reactor 3 can be between 850° C. and 1100° C., for example between 925° C. and 1000° C. It is also possible, in this non-limiting case, to use methane as precursor of the pyrolytic carbon to be deposited. Its flow rate is between 5% and 30% of the flow rate of the carrier gas, for example between 10% and 20% of the flow rate of the carrier gas. Examples of other precursors for pyrolytic carbon include, as gaseous precursor, methane/propane mixtures or natural gas. They can also include liquid precursors such as toluene, cyclohexane or ethanol.

During implementation of the invention, a person skilled in the art will take care to obtain a fluidisation phenomenon during the coating, as usually produced in chemical vapour deposition in a fluidised bed. In order to allow monitoring of the fluidisation, the apparatus 1 comprises a differential pressure sensor 4, enabling evaluation of the pressure drop of the gas traversing the bed. A person skilled in the art can advantageously keep this pressure drop at a value close to (+/−20%) the ratio between the weight of the bed and the cross-section of the reactor 3 in order to guarantee the fluidisation state. A person skilled in the art will also take care to have a relative homogeneity of temperature inside the bed. This thermal property, characteristic of fluidised beds operating optimally, is obtained by the presence of bubbles which ensure an excellent agitation of the short fibres. The heat transfer within the bed is thus largely promoted. Thermocouples 17 located inside a sleeve 15 and centred on the reactor 3 are disposed at various positions in the fluidised bed and allow the isothermal behaviour of the bed to be controlled. The quality of the fluidisation can therefore be evaluated from the maximum difference of the temperatures displayed by the thermocouples. For example, a person skilled in the art could carry out the deposition with a maximum temperature difference less than or equal to 20° C., for high temperature depositions (greater than 800° C.). The coating deposited may include at least one layer of pyrolytic carbon (PyC), boron nitride (BN), silicon-doped boron nitride (BN(Si), with the silicon having a proportion by mass of between 5% and 40%, the balance being boron nitride), silicon nitride $Si_3N_4$ or boron-doped carbon (BC, with boron in an atomic proportion between 5% and 20%, the balance being carbon). The deposited coating can be an interphase having a de-embrittlement function for the composite material which promotes the diversion of possible cracks arriving at the interphase after having propagated in the matrix, preventing or delaying the rupture of the reinforcement by such cracks. The coating deposited on the short fibres 11 can be a single-layer coating. Alternatively, the coating deposited on the short fibres 11 can be a multilayer coating. In this case, the nature of the precursor can be changed between the deposition of the different layers in order to deposit layers of different chemical nature. It is possible, for example, to deposit a first layer of an interphase material and a second layer of a different, refractory material intended to protect the fibres during the formation of the matrix. Such a protective material can be, for example, made of silicon carbide.

The photographs provided in FIG. 4 illustrate the results obtained after implementing a method according to the invention, in which a carbon interphase material of thickness approximately 600 nm has been deposited on short Hi-Nicalon-S fibres of diameter approximately 12 μm, and length between 50 μm and 200 μm.

FIG. 3 illustrates an alternative in which the mixture of short fibres 11 and spacer particles 13 is mixed during coating in order to yet further reduce the risk of obtaining unwanted aggregates. The apparatus comprises a stirring member comprising an element 30 that can rotate about its axis and bearing one or more stirring members 32, for example one more stirring blades 32. The axis of rotation of the rotary element 30 can be co-linear with the height of the reactor 3. The stirring members 32 are positioned in the bed formed by the short fibres 11 and spacer particles 13. The movement of the stirring members 32 (rotation represented by the arrow R in FIG. 3) makes it possible to break up the fibre agglomerates. According to an alternative which is not shown, upstream of the fluidised bed zone, it is possible to position an element for disturbing the flow of the gaseous phase. In this alternative, it is the turbulence induced in the carrier gas which serves to reduce the risk of the appearance of unwanted aggregates. Of course, it is possible to combine these various techniques for reducing the risk of the appearance of unwanted aggregates.

Once the coating has been carried out, the spacer particles can be separated from the coated short fibres by sieving and/or by magnetic attraction as indicated above. The coated short fibres are then recovered and separated from the spacer particles in order to be used as discontinuous fibrous reinforcement of a composite material. A complete separation of the coated short fibres and the spacer particles is possible, or alternatively a partial separation. For example, it is possible that only spacer particles of larger diameter are removed, in order to retain a mixture of smaller spacer particles and coated short fibres. The product obtained after sieving, thus constituted of short fibres and fine spacer particles, both coated, will be employed as discontinuous fibrous reinforcement (fibrous and particulate) of a composite material.

Once the separation has been carried out, a composite material part can be prepared, for example in the manner described below.

A mixture can be prepared comprising a binder and the coated short fibres. The binder may for example comprise a polymer, such as a thermoplastic or thermosetting resin or a plasticiser. It may be advantageous to heat the mixture in order to fluidise the binder to facilitate the mixing and allow better homogenisation. A preform of the part to be manufactured is then formed by moulding the prepared mixture, for example by injecting the mixture into the cavity of a mould. The binder present in the preform is then removed in order to obtain a preform from which the binder has been removed. The removal of the binder can be carried out by pyrolysis so as to leave behind a consolidating phase improving the shape retention of the fibrous preform. The fibrous preform is not woven. The fibrous preform is porous and its pores are intended to be filled by a matrix.

The matrix is then formed. The matrix coats the short fibres. The matrix can be formed by melt infiltration of the pores of the porous preform by a molten composition comprising the molten silicon, in order to obtain the part. The molten composition can consist of pure molten silicon or, alternatively, can be in the form of a molten alloy of silicon and one or more other constituents. A part made of CMC material is then obtained. Alternatively, another type of matrix can be formed, such as an organic or carbon matrix. Various techniques for forming the matrix are possible, such as chemical vapour infiltration or the methods of infiltration and pyrolysis of matrix precursors in the liquid state. Alternatively, the coated fibres separated from the spacer particles can be mixed with the matrix material or with a matrix precursor and then this mixture introduced into a mould. The part can then be obtained by treatment of the mixture introduced into the mould, for example in order to cross-link the matrix material or for pyrolysis of the precursor.

The part obtained can be a turbomachine part, for example a part of an aeronautical turbomachine or industrial turbomachine. The part obtained can be a turbine part. The part obtained can be a turbomachine blade, for example a turbine blade. The part obtained can alternatively be a turbine ring sector.

The expression "between . . . and . . . " should be understood as including the limits.

The invention claimed is:

1. A method for coating fibres, comprising:
coating short fibres having an average length less than or equal to 5 mm by chemical vapour deposition in a fluidised bed, the short fibres treated being made of ceramic material or carbon and being mixed with spacer particles distinct from the short fibres, said spacer particles having an average diameter greater than or equal to 20 μm, the spacer particles belonging to Geldart groupings A or B and the content by volume of spacer particles in the mixture with the short fibres being between 25% and 95%.

2. The method according to claim 1, wherein the spacer particles are present at a level between 50% and 95% by volume in the mixture with the short fibres.

3. The method according to claim 1, wherein the average diameter of the spacer particles is greater than or equal to 50 μm.

4. The method according to claim 3, wherein the average diameter of the spacer particles is greater than or equal to 100 μm.

5. The method according to claim 1, wherein, during the coating, the mixture of short fibres and spacer particles is stirred using a stirring member.

6. The method according to claim 1, wherein the short fibres and the spacer particles are present in a reactor during the coating, and wherein a vibratory motion is imposed on said reactor during the coating, using a vibrating member.

7. The method according to claim 1, wherein the short fibres are made of silicon carbide, and wherein, on the short fibres, is deposited at least one layer of: pyrolytic carbon, boron nitride, silicon-doped boron nitride, silicon nitride or boron-doped carbon.

8. The method according to claim 1, wherein the method comprises:

introducing short fibres and spacer particles into a reactor, the short fibres being coated with a sizing, desizing so as to remove all or part of the sizing of the short fibres in the reactor, and then coating the short fibres in the reactor as defined in claim 1.

9. A method for manufacturing a composite material part, comprising:

implementing a method according to claim 1 in order to obtain coated short fibres, separating the coated short fibres from at least a portion of the spacer particles, moulding the coated short fibres thus separated from the spacer particles so as to form a porous preform of the part to be obtained, and forming a matrix in the pores of the preform in order to obtain the composite material part.

10. A method for manufacturing a composite material part, comprising:

implementing a method according to claim 1, in order to obtain coated short fibres, separating the coated short fibres from at least a portion of the spacer particles, mixing the coated short fibres thus separated from the spacer particles with the matrix material or with a matrix precursor, and introducing the mixture thus obtained into a mould and the heat treatment of the introduced mixture, in order to obtain the composite material part.

* * * * *